METHOD OF FORMING MESH-LIKE STRUCTURE

Filed May 20, 1964 3 Sheets-Sheet 1

INVENTORS:
ARTHUR J. LEARN,
RUEBEN S. SPRIGGS,
BY
Jerry A. Dinardo
AGENT.

INVENTORS:
ARTHUR J. LEARN,
RUEBEN S. SPRIGGS,
BY
Jerry G. Dinardo
AGENT

METHOD OF FORMING MESH-LIKE STRUCTURE

INVENTORS:
ARTHUR J. LEARN,
RUEBEN S. SPRIGGS,
BY Jerry A. Dinardo
AGENT.

3,355,320
Patented Nov. 28, 1967

3,355,320

METHOD OF FORMING MESH-LIKE STRUCTURE

Rueben S. Spriggs, San Pedro, and Arthur J. Learn, Torrance, Calif., assignors to TRW Inc., a corporation of Ohio Filed May 20, 1964, Ser. No. 368,811
15 Claims. (Cl. 117—210)

ABSTRACT OF THE DISCLOSURE

There is disclosed a method of forming a thin film fine mesh structure by vacuum depositing a discontinuous film of a first material on a substrate, vacuum depositing a film of a second material over said first film to fill in the voids thereof to a depth less than the thickness of the first film, and treating the composite film structure with a chemical that etches away the first film but leaves the second material intact in the form of a fine mesh grid.

*Background of the invention*

This invention relates to the art of fabricating thin films, and more particularly to improvements in forming thin mesh-like films having high sheet resistance and/or transparency.

Thin films which are electrically conductive and yet exhibit either high sheet resistance or transparency to light or particle radiation such as electrons, find use in many applications. For example, such films may be useful in certain solid state light amplifying devices, in electron image tubes, and in thin film integrated circuits, to mention a few uses.

In the past, thin mesh-like conductive films have been formed by evaporating metal first through a masking grill of parallel wires running in one direction and then through the same grill with the wires running perpendicular to the first direction. The foregoing method is subject to alignment and scattering problems and does not lend itself readily to control over the optical transmission and resistive characteristics of the film.

Accordingly, an object of this invention is to provide an improved method of fabricating electrically conductive films of high sheet resistance.

A further object is to provide a method of forming thin mesh-like conductive films whose sheet resistance and optical transmission are readily controllable.

Another object is to provide an improved thin film electronic device including a thin film mesh grid.

Yet another object is to provide an improved method of manufacturing a thin film electronic device.

This invention is based on the observation that in the early stages of the formation of a vacuum evaporated film, the deposit consists of small nuclei in the form of isolated islands or agglomerates of the condensate. As the thickness is increased, the nuclei grow larger by direct receipt of vapor atoms and by combination with other nuclei. It has been observed that for conductive film materials, the merger of nuclei is the predominant process for thicknesses at which films first exhibit electrical continuity.

According to one feature of the invention, it has been found that by forming a film which is the negative of the directly deposited agglomerated film, an electrically conductive film exhibiting a large ohms per square of sheet resistance and/or a conductive film which shows high transmission can be realized.

A process for fabricating a thin mesh-like electrically conductive film according to one embodiment of the invention comprises first forming by vacuum deposition, an agglomerated film made up of tiny islands of a first metal on a substrate. A second metal film is vacuum deposited over the first agglomerated film so as to fill in the voids between the islands of the first metal film to a depth less than the thickness of the islands. At this stage, the tops of the islands may be coated with the second metal film but the sides remain bare. Next the composite film structure is treated with a chemical etchant that dissolves the first metal film but does not react with the second metal film. As the etchant reacts with the nuclei of the first metal film, the portions of the second metal film coating the islands of the first film and not adhering directly to the substrate are removed to leave the second metal formed into a mesh-like structure.

*Description of the preferred embodiment*

Figure 1:
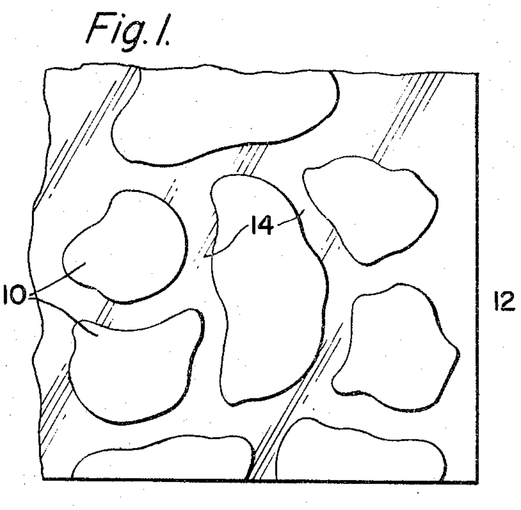
FIG. 1 is a greatly enlarged plan view showing an agglomerated thin film deposit during initial stages of the method of the invention.
Figure 2:
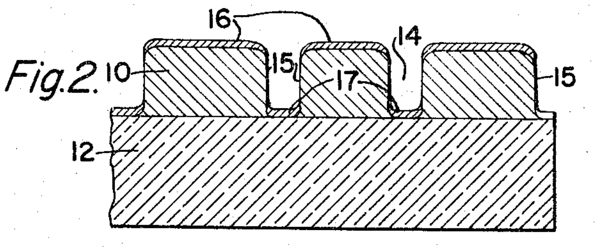
FIG. 2 is a greatly enlarged sectional view showing a composite film deposit during intermediate stages of the method of the invention.

Referring to FIGS. 1 and 2, a method of forming a thin mesh-like film according to the invention comprises vacuum depositing a film 10 of a first material onto a substrate 12 to a thickness such that the first film 10 is in the form of many tiny islands with interconnecting voids 14 or bore areas remaining on the substrate 12 between the islands. Quartz or glass, or any other material on which the first film 10 agglomerates, may be used for the substrate 12. The thickness of the first film 10 may typically be between a few hundred angstroms and a few microns.

As shown in FIG. 2, a second material is deposited to form a second film having isolated portions 16 coating the islands of the first film 10 and continuous portions 17 covering the bare areas of the substrate 12 so as to fill in the voids 14 to a depth less than the thickness of the first film 10. The second film may be about 400 angstroms thick.

The material of the second film must exhibit little tendency to agglomerate at ordinary temperatures near room temperature. Generally, the tendency of a material to form an agglomerated structure is directly related to the difference between its melting point temperature and the temperature of the substrate on which it is deposited. Those materials, such as indium, lead, tin, selenium, and sulfur, with low melting point temperatures, show pronounced agglomeration at or near room temperature. Such materials are conveniently used for the first film 10. On the other hand, materials such as chromium, aluminum, copper, or gold, with high melting point temperatures, form continuous films at thicknesses less than 100 angstroms for deposition at or near room temperature. These latter materials may be used for the second film where an electrically conductive film is desired. However, where dielectric films are desired, such materials as silicon monoxide, zinc sulfide, or aluminum oxide may be used for the second film.

When the cross section of the agglomerates comprising the first film 10 is that shown, the second film will have generally the thickness distribution shown. This occurs since the amount of material deposited is proportional to the cosine of the angle between the direction of the incident vapor and the normal to the surface on which the vapor impinges. Thus, if the vapor is directed normal to the substrate surface, the steep side portions 15 of the first film 10 will remain bare and free from the second film material.

Figure 3:
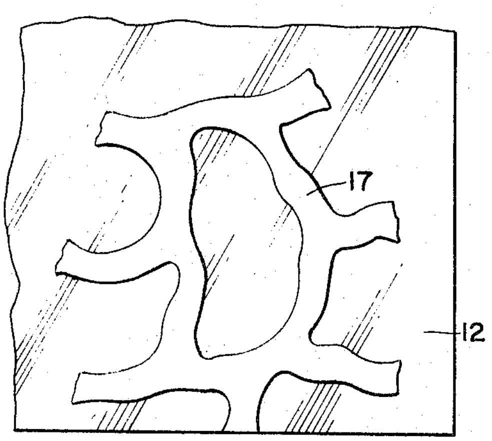
FIG. 3 is a greatly enlarged plan view of a thin film mesh grid formed according to the method of the invention.

An etchant is then applied to the composite films. Reaction takes place with the first film 10 material at the uncoated side portions 15 but not with the second film portions 16 and 17. As the first film 10 is etched away, the top portions 16 of the second film coating the first film 10 are loosened from the substrate 12 and may be washed away. In certain instances more complete removal of these sections may be effected by spreading adhesive tape over the composite structure and pulling off the loose parts of the film. In either case, upon removal of the first film 10, there remains the continuous portions 17 in the form of a mesh or grid adhering to the substrate 12, as shown in FIG. 3.

The second film material must accordingly satisfy two requirements in addition to its property of forming continuous films at small thicknesses. It must form films which adhere exceedingly well to the substrate and must be passive to the action of the etchant for the first film material. As an example, chromium is found to fulfill these requirements for the second film with indium as the first film 10 and dilute nitric acid used as an etchant.

A vacuum system which may be used to perform the film deposition is described in U.S. Patent 3,117,025. Provision is made for deposition onto four optically smooth quartz or glass substrates during a single evacuation of the system. Substrates may be mounted on a well the temperature of which (and hence substrate temperature) can be controlled by addition of coolants or a heater. A multiplicity of groups of four masks each is mounted on a rotatable wheel so that any group can be brought into position beneath the substrates. The electrical conductance of films deposited on two of the four substrates can be monitored during deposition.

For studying some of the properties of the films, deposition of the first material, such as indium, on one of the four substrates is first carried out to determine the time to achieve the critical thickness $t_c$ for onset of electrical conduction. Then, deposition of indium films having a thickness which is a certain fraction of the critical thickness $t_c$ on the remaining substrates may be accomplished by timing the duration of this deposition while using a constant deposition rate from radiatively heated sources. Similarly, one substrate, which is masked off during the indium evaporation, may be used to monitor the conductance of a conventional chromium strip as it is deposited. Chromium powder is preferably evaporated from a tantalum or molybdenum strip having a recessed portion holding the chromium.

Figure 4:
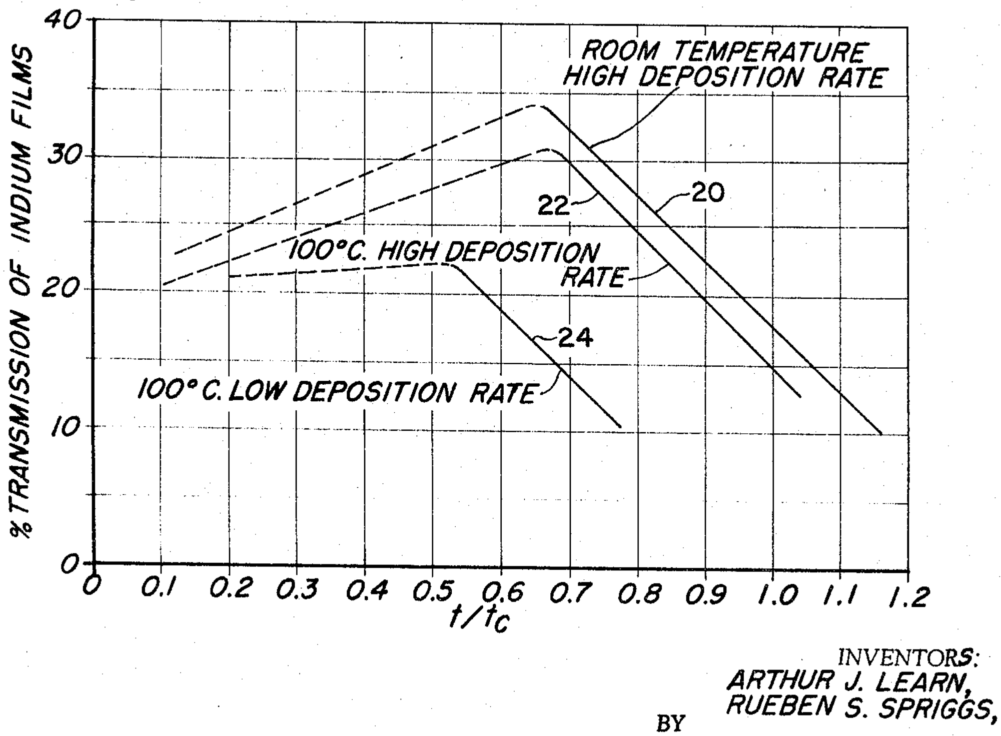
FIG. 4 is a graph of curves showing the percent transmission of indium agglomerated films as a function of thickness ratio $t/t_c$.
Figure 5:
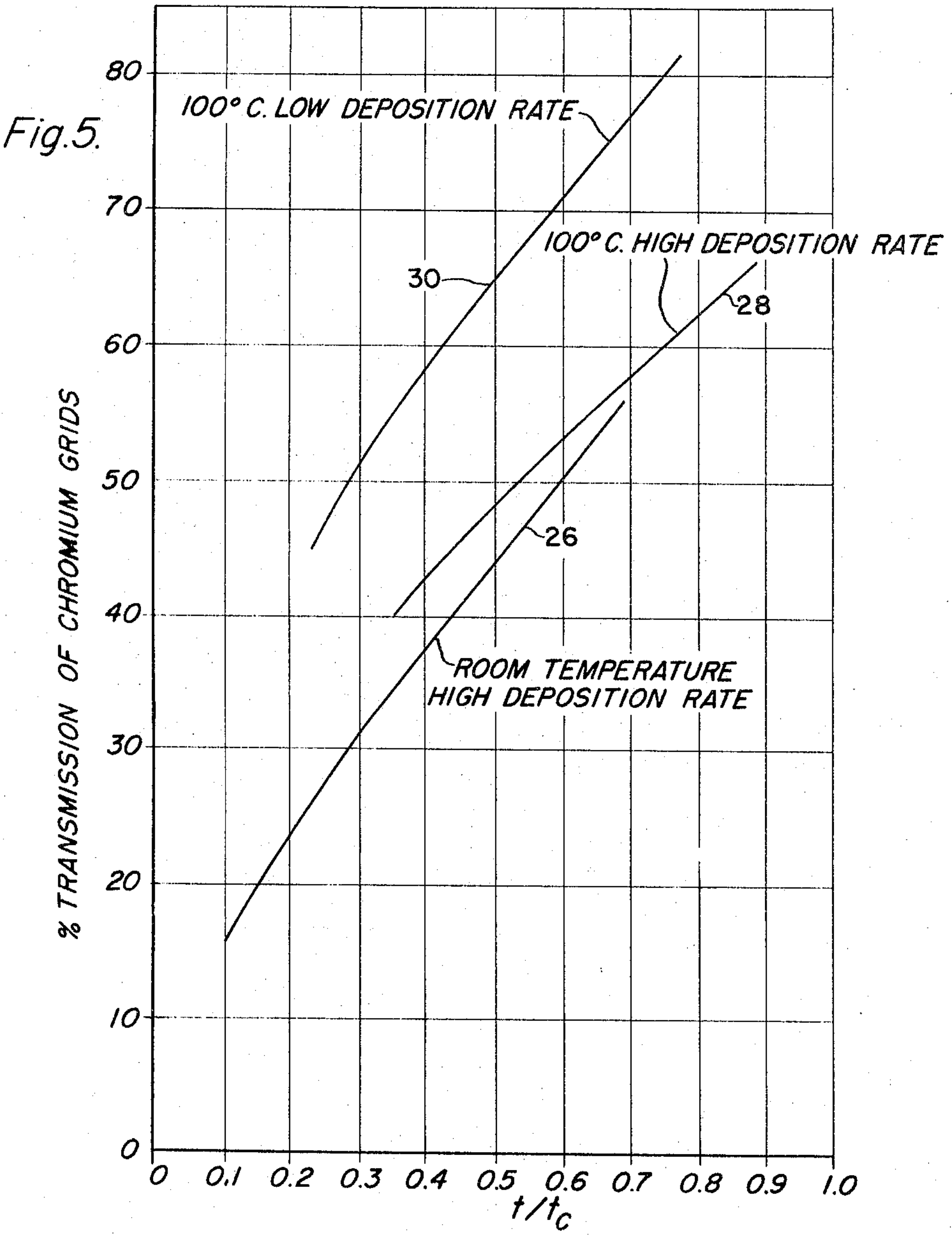
FIG. 5 is a graph of curves showing the percent transmission of chromium grids as a function of thickness ratio $t/t_c$.

Some of the properties of indium and chromium films will now be discussed as they relate to the underlayer or first film 10 and the grid 17, respectively. Referring now to FIG. 4 there is shown a graph in which the percent transmission for indium underlayer films is plotted as a function of normalized thickness, that is, the ratio of indium film thickness ($t$) to the critical thickness ($t_c$) at which electrical conduction of the indium film first occurs. Curve 20 was plotted for a substrate maintained at a room temperature of 23° C. The deposition times to achieve electrical conduction, at the critical thickness ($t_c$), ranged from 1.00 to 2.63 minutes. Curve 20 thus represents a high film deposition rate at room temperature. Curves 22 and 24 were plotted for a high substrate temperature of 100° C. Curve 22 is for a low film deposition rate in which the deposition time for reaching critical thickness ($t_c$) ranged from 1.88 to 10.0 minutes. Curve 24 is for a high film deposition rate, in which the deposition time for reaching critical thickness ($t_c$) ranged from 340 to 393 minutes. As used herein, a high deposition rate is of the order of 50 angstroms per second, while a low deposition rate is about 1 angstrom per second. Similarly, FIG. 5 shows a graph in which the percent transmission for chromium grids is plotted as a function of the ratio of indium underlayer film thickness ($t$) to the critical thickness ($t_c$) at which electrical conduction of the indium underlayer film first occurs. Curve 26 was plotted for the same conditions as curve 20 of FIG.4, that is, for a substrate at room temperature and a high deposition rate. Curve 28 was plotted for the same condition as curve 22, namely a high substrate temperature of 100° C. and a high deposition rate. Curve 30 was plotted for the same condition as curve 24, namely a high substrate temperature of 100° C. and a low deposirate. The optical transmission characteristics of the films were measured with a commercially available transmission densitometer-photometer unit.

As shown in FIG. 4, the measured transmission for indium underlayer films was found to be maximum for $$t/t_c \approx 0.5$$

Reduced transmission for $t/t_c \lesssim 0.6$, shown in the broken line portions of the curves, appears to arise as a result of diffraction effects when the dimensions of the film structure become comparable with the wavelength of the light used to examine the film. Evidence supporting this conclusion comes from the fact that transmission measured from an electron micrograph showed a monotonic decrease with increasing $t/t_c$ at all values. Such effects may also occur to a smaller extent for $t/t_c > 0.6$, possibly accounting for the fact that the sum of the transmissions for a given indium underlayer film and its chromium complement is somewhat less than 100%.

A comparison of curves 20 and 22 of FIG. 4 shows that the optical transmission of the indium underlayer film is not affected strongly by substrate temperature. However, a comparison of curves 22 and 24 shows that the optical transmission of the indium underlayer film is lower for low deposition rates than it is for high deposition rates.

Similarly, curves 26 and 28 show that the transmission of the chromium grid is not affected greatly by the temperature at which the indium is deposited. Curves 28 and 30 show that the optical transmission of the chromium grid is higher for low deposition rates than it is for high deposition rates. This is as expected, since the chromium grid is the complement of the indium underlayer film and would show opposite optical transmission characteristics.

A study of micrographs taken of the indium underlayer film and the chromium grid shows that increasing the temperature of the substrate when depositing the indium underlayer film increases the scale of the film structures. That is, for a given $t/t_c$ ratio the islands of indium and the spacing between them become proportionately larger, and the chromium grid structure becomes coarser. Decreasing the deposition rate also increases the scale of the film structures. Furthermore, at lower deposition rates, many small nuclei appear in the voids between the indium islands and the boundaries of the islands extend further into the voids. These two structural differences account for the decreased transmission of indium films and the increased transmission of the chromium grids. Tin and lead films used in place of the indium show a similar structural change with decreasing deposition rate. It is usually desirable in using the present method to select temperatures and deposition rates which will give a very fine mesh structure. In practice, the agglomerates and voids between them, as seen in the drawing, are of the same order of magnitude and the thickness of the film is approximately equal to the width of the individual agglomerates. For the materials specified herein, agglomerates and void dimensions as small as 10 to 100 Angstrom units ($10^{-9}$ to $10^{-8}$ meters) are attainable. The finest mesh heretofore available by resist techniques has been no smaller than 10 microns ($10^{-5}$ meters); there is thus an improvement of three or four orders of magnitude. The relationships discussed immediately above together with electronic micrographs showing actual sizes of films produced by this process are discussed in greater physical detail in an article written by the applicants herein, A. J. Learn and R. S. Spriggs, and published in the October 1963 issue of the "Journal of Applied Physics," extending from page 3012 through 3021. Attention is particularly drawn to the electronic micrographs comprising FIGURES 8, 9, 10, and 11 of that article wherein a marking indicating one micron is available for comparison with actual agglomerate sizes.

The curves of FIG. 5 show that the transmission of the chromium grid increases approximately linearly for increasing thickness of the indium underlayer film. At an indium film thickness of 0.8 times the critical thickness, the optical transmission of the chromium grid is 60% at high deposition rates and 80% at low deposition rates.

Figure 6:
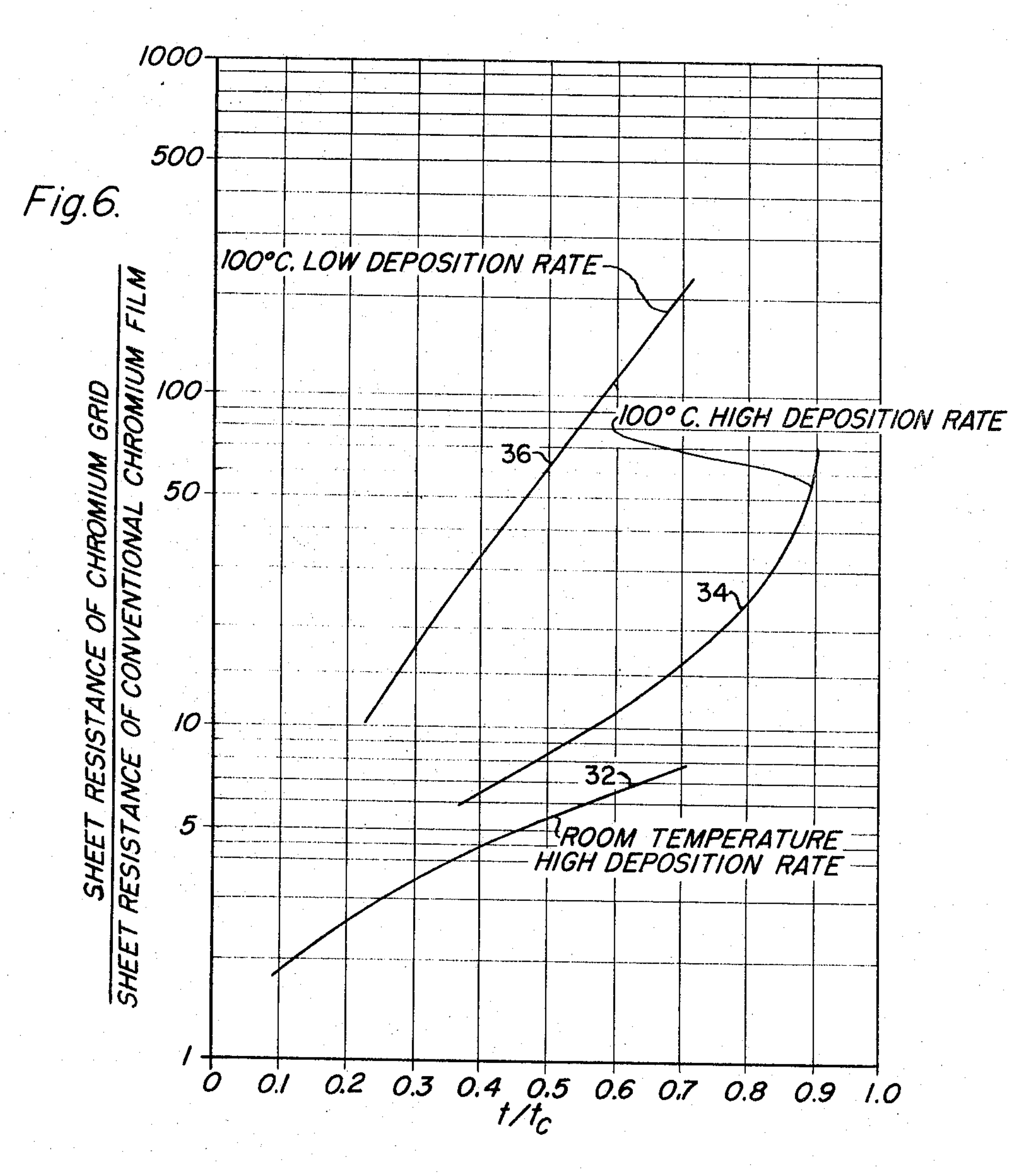
FIG. 6 is a graph of curves showing the ratio between sheet resistance of a chromium grid to sheet resistance of a conventional chromium film as a function of thickness ratio $t/t_c$.

FIG. 6 shows a graph plotting the ratio of the electrical resistance per square of the chromium grid to the resistance per square for a conventional chromium film deposited directly on quartz. The resistance ratio is plotted as a function of the ratio $t/t_c$ for indium. Curve 32 is for a substrate maintained at a room temperature of 23° C. and for high indium film deposition rate. Curve 34 is for a substrate maintained at a high temperature of 100° C. and for a high indium film deposition rate. Curve 36 is for a substrate monitored at a high temperature of 100° C. and for a low indium film deposition rate.

A comparison of curves 32 and 34 shows that at a given value of $t/t_c$ the resistance ratio is relatively independent of substrate temperature for the indium underlayer deposition. This fact is consistent with the observation that the pattern of film structures of both the indium film and chrominum grid depends only slightly on temperature. The marked increase in the resistance ratio with decreasing deposition rate, shown from a comparison of curves 34 and 36, apparently is the result of the removal of chromium from all parts of the substrate previously covered with indium including the regions where the boundary of the indium islands extends into the voids and where tiny indium nuclei appear in the voids. Conducting regions of the chrominum grid can in this way become very narrow. This is consistent with the higher optical transmission exhibited by such grids.

The curves of FIG. 6 show that the resistance ratio of the chromium grid to the conventional chromium film increases rapidly with increasing thickness of the indium underlayer film. At an indium underlayer film thickness of .8 times the critical thickness, the resistance ratio is about ten at high indium film deposition rates (curves 32 and 34) and is between 100 and 1000 at low deposition rates (curve 36). Measured values of sheet resistance for conventional chromium films are generally found to be 10 to 20 ohms per square. Thus it is seen that through the use of chromium grid structures formed according to the method of the invention, it is possible to obtain reproducible sheet resistances as high as 20,000 ohms per square for chromium films as thin as 400 angstroms.

To summarize the data contained in the graphs of FIGS. 4–6, it is seen that the optical transmission and resistive properties of a mesh-like conductive film fabricated in accordance with the method of the invention can be controlled over a wide range by controlling the film deposition rate, and the thickness of the underlayer.

Figure 7:
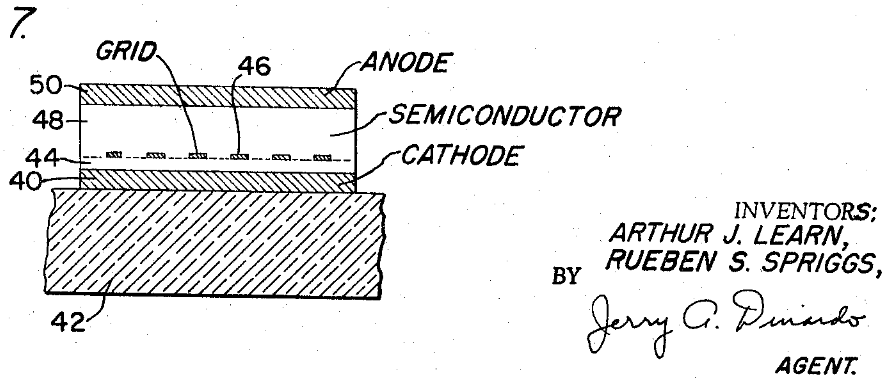
FIG. 7 is a greatly enlarged sectional view of a dielectric triode utilizing a thin film mesh grid fabricated according to the method of the invention.

A thin mesh-like conductive film formed according to the method of the invention can be used as a control grid in a thin film dielectric triode, such as one of the kind disclosed in an article by G. T. Wright in the Journal of the British IRE, May 1960, pages 337–350. Referring to FIG. 7, a thin film dielectric triode may be fabricated by depositing a first conductive film 40, which serves as an emitter or cathode, on an insulating substrate 42. The cathode film 40 is coated with a first thin layer 44 of semi-conductive material. The thickness of the first semi-conductive layer 44 determines the desired spacing between the cathode film 40 and the control grid 46 which is deposited next.

The cathode film 40 must make ohmic contact to the semiconductive layer 44. An ohmic contact is one wherein there exists no potential barrier at the interface of the cathode film 40 and semiconductive layer 44. In the case of an n-type semiconductor in contact with a metal, for example, there is no potential barrier at the junction of the two materials, under equilibrium conditions, because there is no significant difference in level between the conduction band of the semiconductor and that of the metal. A suitable semiconductive material for the layer 44 is cadmium sulfide, which is commonly observed to be n-type. However, the choice of semiconductive materials need not be restricted to n-type materials, and suitable p-type film forming materials be used. In conjunction with cadmium sulfide, suitable materials for the cathode film 40 for making ohmic contact to cadmium sulfide are indium and aluminum. Both the cathode film and the semiconductive layer 44 may be formed by vacuum deposition.

The foraminous or mesh-like control grid 46 is next deposited on the first semiconductive layer 44. The control grid 46 is fabricated according to the method of the invention as described above. It is necessary to select a material for the control grid that forms a blocking or rectifying contact with the semiconductive material, as opposed to an ohmic contact. That is, a potential barrier at the junction of the two materials exists because the levels of the conduction bands of the two materials differ significantly at the junction of the two materials. Suitable materials for the control grid 46 are metals having a relatively high work function, such as gold, copper, platinum, or tellurium. For forming the control grid 46 of gold or platinum, indium may be used as an underlayer and dilute nitric acid as the etchant, according to the invention.

A second semiconductive layer 48 preferably of the same material as the first semiconductive layer 44 is next deposited over the control grid 46 to a thickness substantially greater than that of the first layer 44. The layers 44 and 48, while being shown and described as being formed in two separate operations, will in fact merge into a single substantially homogeneous layer if deposited under substantially the same conditions.

A second conductive film 50 which serves as the anode or collector is finally deposited on the semiconductive layer 48. As with the cathode film 40, the anode film forms an ohmic contact with the semiconductive material and may be made of the same material as the cathode film 40. The thin film dielectric triode above described is analogous to the vacuum tube triode, with electrons moving through a solid dielectric material instead of through a vacuum. Thus the function of the cathode film 40 is to inject carriers, or electrons, into the semiconductor, which is essentially an insulating region. The anode film 50 accepts the carriers which have traversed the semiconductor from the cathode. The control grid 46 controls the current in the semiconductor by way of the electrostatic field existing between the grid 46 and cathode film 40. Amplification is achieved because the control grid 46 is closer to the cathode film 40 than the anode film 50 is to the cathode film 40 and hence, for the same applied voltage, the grid-cathode fields are greater than the anode-cathode fields. Little grid current is drawn because of the high impedance blocking contact between the control grid 46 and the semiconductor.

For this application, the control grid should have a relatively high optical transmission to permit high electron transmission. The spacing between the control grid 46 and the cathode film 40 is substantially equal to the spacing between the conductors making up the grid mesh.

The embodiments of the invention in which an exclusive property or privilege is claimed are defined as follows:

1. A method of forming a mesh-like structure, comprising:

producing a multiplicity of tiny agglomerates by vacuum depositing a first material on a substrate;

filling the voids between said agglomerates with a second material to a depth less than the thickness of said agglomerates;

and removing said agglomerates to leave said second material formed into a mesh-like structure on said substrate.

2. The invention according to claim 1, wherein said second material is electrically conductive.

3. The invention according to claim 1, wherein said second material is a dielectric material.

4. A method of forming a thin film resistive grid comprising:

producing a layer of a multiplicity of islands by vacuum depositing a first material on a substrate;

coating said layer with a second electrically conductive material so as to fill in the voids between said islands but to leave the side portions thereof uncoated;

and treating the composite layered structure with a chemical agent that attacks said first material without attacking said second electronically conductive material to remove said islands while leaving a grid of said second electrically conductive material.

5. The invention according to claim 4, wherein said electrically conductive material is a material selected from the group consisting of chromium, aluminum, copper, and gold.

6. A method of forming a thin film mesh-like structure comprising:

vacuum depositing a discontinuous film of a first material on a substrate;

vacuum depositing a film of a second material over said discontinuous film to fill in the voids thereof to a depth less than the thickness of said discontinuous film;

and treating the composite film structure with a chemical that etches away said first film but leaves said second material intact in the form of a fine mesh grid.

7. The invention according to claim 6, wherein said second material is a dielectric material.

8. The invention according to claim 7, wherein said second material is a material selected from the group consisting of silicon monoxide, zinc sulfide, and aluminum oxide.

9. A method of fabricating a fine conductive grid, comprising:

vacuum depositing on a supporting surface a coating made up of a multiplicity of tiny agglomerates of a first material selected from the group consisting of indium, tin, lead, selenium, and sulfur;

vacuum depositing on said coating an overlayer of a conductive material different from the first material;

said overlayer being of a thickness less than that of said agglomerates but thick enough to continuously coat the portions of the supporting surface not covered by the agglomerates;

and dissolving said agglomerates and removing those portions of the conductive material adhering thereto to leave an electrically continuous grid of said conductive material.

10. A method of fabricating a fine grid of chromium, comprising:

vacuum depositing on a supporting surface a multiplicity of closely spaced islands of metal selected from the group consisting of indium, tin, and lead;

said islands having a predetermined thickness;

vacuum depositing on the supporting surface in the spaces between said islands a layer of chromium of a thickness less than said predetermined thickness, said chromium layer having a thickness of the order of hundreds of angstroms;

and treating the composite metal-chromium structure with a chemical agent to remove said metal and the portions of chromium adherent thereto, while leaving the chromium on the supporting surface in the form of a fine grid.

11. A method of fabricating a fine-mesh grid of chromium, comprising:

forming on a supporting surface an agglomerated film of metal selected from the group consisting of indium, tin, and lead, to leave continously extending portions of the supporting surface uncoated by said film;

applying a film of chromium over said agglomerated film to substantially completely cover the previously uncoated portions of the supporting surface;

said chromium film being of insufficient thickness to completely cover individual islands of said agglomerated film;

applying a chemical etchant to the composite metal-chromium structure to dissolve said agglomerated film and loosen the portions of chromium carried thereby without removing the chromium adhering to the supporting surface;

and removing the loosened portions of chromium to leave an adherent fine-mesh grid of chromium on said supporting surface.

12. The invention according to claim 11, wherein said chemical etchant consists of dilute nitric acid.

13. The invention according to claim 11, wherein the step of forming said agglomerated film is carried out by maintaining said supporting surface at a temperature between 23° and 100° C.

14. A method of forming a thin film electronic device, comprising:

depositing a first conductive film on a substrate;

depositing a first layer of predetermined thickness of semiconductive material on said conductive film;

producing a multiplicity of tiny agglomerates of a first material on said semiconductive layer;

said agglomerates being spaced apart a distance substantially equal to said predetermined thickness;

filling the voids between said agglomerates with a conductive material to a depth less than the thickness of said agglomerates;

removing said agglomerates to leave said conductive material formed into a mesh-like grid;

depositing a second layer of semiconductive material on said grid of a thickness substantially greater than said predetermined thickness;

and depositing a second conductive film on said second semiconductive layer.

15. A method of embedding a thin film mesh-like structure made of a first material within a member made of a second material different from said first material, said method comprising:

providing a supporting layer made of said second material;

depositing a layer made up of multiplicity of tiny agglomerates of a given material on said supporting layer;

depositing a layer of said first material so as to cover the areas of said supporting layer not covered by said agglomerates while exposing at least part of each one of said agglomerates;

removing said agglomerates from said supporting layer while leaving the layer of said first material intact as a mesh-like structure;

and covering said mesh-like structure and the interstices thereof with an additional layer of said second material.

References Cited

UNITED STATES PATENTS

| | | | |
|---|---|---|---|
| 2,000,310 | 5/1935 | White et al. | 117—5.5 |
| 2,168,259 | 8/1939 | Gorlich | 117—210 |
| 2,416,720 | 3/1947 | Teal | 117—5.5 |
| 2,728,693 | 12/1955 | Cado | 117—5.5 X |
| 3,002,847 | 10/1961 | Shaffer et al. | 117—5.5 |

WILLIAM L. JARVIS, *Primary Examiner.*